United States Patent [19]

Chiapparoli, Jr.

[11] 4,041,403
[45] Aug. 9, 1977

[54] DIVIDE-BY-N/2 FREQUENCY DIVISION ARRANGEMENT

[75] Inventor: Richard Samuel Chiapparoli, Jr., Freehold, N.J.

[73] Assignee: Bell Telephone Laboratories, Incorporated, Murray Hill, N.J.

[21] Appl. No.: 599,341

[22] Filed: July 28, 1975

[51] Int. Cl.² ................ H03K 21/00; H03K 23/08
[52] U.S. Cl. ......................... 328/39; 307/220 R; 307/225 R; 328/46
[58] Field of Search .............. 307/220 R, 225 R; 328/39, 41, 46

[56] References Cited

U.S. PATENT DOCUMENTS

| | | | |
|---|---|---|---|
| 3,189,832 | 6/1965 | Pugh | 328/42 |
| 3,430,067 | 2/1969 | Baum | 307/225 |
| 3,446,947 | 5/1969 | Overstreet, Jr. | 328/39 |
| 3,571,728 | 3/1971 | Andrea et al. | 328/41 |
| 3,818,354 | 6/1974 | Tomisawa et al. | 328/41 |
| 3,896,387 | 7/1975 | Kokado | 328/39 |

FOREIGN PATENT DOCUMENTS 105,829  7/1974  Japan

*Primary Examiner*—Stanley D. Miller, Jr.
*Attorney, Agent, or Firm*—Howard R. Popper; Frederick W. Padden

[57] ABSTRACT

An arrangement for frequency division of a symmetrical pulse train by N/2 where N is an odd integer greater than 1; this arrangement does not require the use of any one-shot multivibrators or delay elements and employs only $\log_2(N+1)$ flip-flops in its design. In one embodiment a two state gating circuit selectively allows either the input pulse train or its inverse to be fed to a modulo $(N+1)/2$ counter. The state of the gating circuit is controlled by a flip-flop which toggles whenever the counter reaches its maximum count. In addition, the counter produces an output pulse as it advances through each of its counting sequences. Thus, the counter, which advances in response to falling pulse edges, alternates between counting falling edges of the input pulse train and the inverted input pulse train thereby counting to $N+1$ in $N$ pulse periods while yielding two equally-spaced output pulses.

3 Claims, 6 Drawing Figures

DECADE COUNTER WITH DECODING AND GATE

DIVIDE-BY-N/2 FREQUENCY DIVISION ARRANGEMENT

BACKGROUND OF THE INVENTION

This invention relates to pulse frequency division and more particularly, to an arrangement for frequency division by N/2 where N is an odd integer other than one.

In C. W. Pugh U.S. Pat. No. 3,189,832, issued June 15, 1965, there is shown an arrangement for N/2 pulse frequency division which employs a module N+1 counter. The output pulse of the counter is derived by utilizing AND gates that are enabled when a particular count is reached. By making available both the input signal and its inverse to the counter, the output pulse may be made to appear either during the first half or during the second half of a pulse period. In that patent the approach taken is to employ a first decoding AND gate to yield an output pulse during the first half of the first pulse period and a second such AND gate to trigger a one-shot multivibrator during the second half of the $[(N+1)/2]^{th}$ pulse period. The operated one-shot multivibrator, in turn, produces a second output pulse and in addition causes the counter to prematurely advance its count by one. Thereafter, the counter continues to advance to N+1 and then recycles. Thus, in this approach a count of N+1 is achieved in N pulse periods and results in two equally spaced output pulses.

While the above-described frequency division arrangement appears to be satisfactory for a given input pulse frequency, its general applicability is somewhat limited. The maximum repetition rate of the incoming pulse signal is limited by the need of the one-shot multivibrator to return to a stable state after each input pulse. It would, therefore, be desirable to provide an N/2 frequency divider that is independent of the frequency of the input signal.

A frequency divider that does not use a one-shot multivibrator or any other delay element has been described in the prior art U.S. Pat. No. 3,571,728 of J. J. Andrea et al., issued Mar. 23, 1971. In that arrangement two module N counters are employed so that the output pulse of any given counter occurs exactly between two consecutive output pulses of the other counter. Synchronism is maintained between the two counters by causing the first counter, when it achieves a count of (N+1)/2, to reset the second counter. The output pulse of the divider occurs when neither of the output levels of the counters is high.

While this arrangement overcomes the abovementioned frequency dependency problem, its design requires at least $2(\log_2 N)$ flip-flops. It would be useful to provide an N/2 frequency divider whose operation is frequency independent and whose design significantly reduces from $2(\log_2 N)$ the number of flip-flops required.

SUMMARY OF THE INVENTION

I have devised a divider circuit which employs a module (N+1)/2 counter plus an additional control flip-flop but does not contain any one-shot multivibrators or delay elements. In accordance with my invention in one illustrative embodiment thereof, each of the flip-flops that comprise the counter as well as the control flip-flop changes state upon detecting the falling edge of an incoming pulse. The additional flip-flop controls a bi-state gating circuit which, according to its state, passes either the divider input signal or its inverse to the counter.

Initially, the control flip-flop is set to a logical zero thereby allowing the gating circuitry to pass an inverted version of the input signal to the counter. Thus, regarding the counter's operation from the point of view of the divider's input signal, the first output pulse is produced when (N+1)/2 rising pulse edges have been detected. In addition, the state of the control flip-flop is changed to logical one, in turn, causing the gating circuitry to pass a replica of the input signal to the counter. Thus, when (N+1)/2 falling edges have been detected, the counter produces a second divider output pulse and also causes the control flip-flop to return to state zero whereupon the entire process is repeated.

Accordingly, the timing of the operation of the divider is derived from the edges of the input signal and does not depend on the operation of any frequency dependent delay elements. In addition, my arrangement significantly reduces the number of required flip-flops to $\log_2(N+1)$.

BRIEF DESCRIPTION OF THE DRAWING

The foregoing and other objects of my invention may become more apparent from the ensuing description and drawing in which.

DETAILED DESCRIPTION

Figure 1:
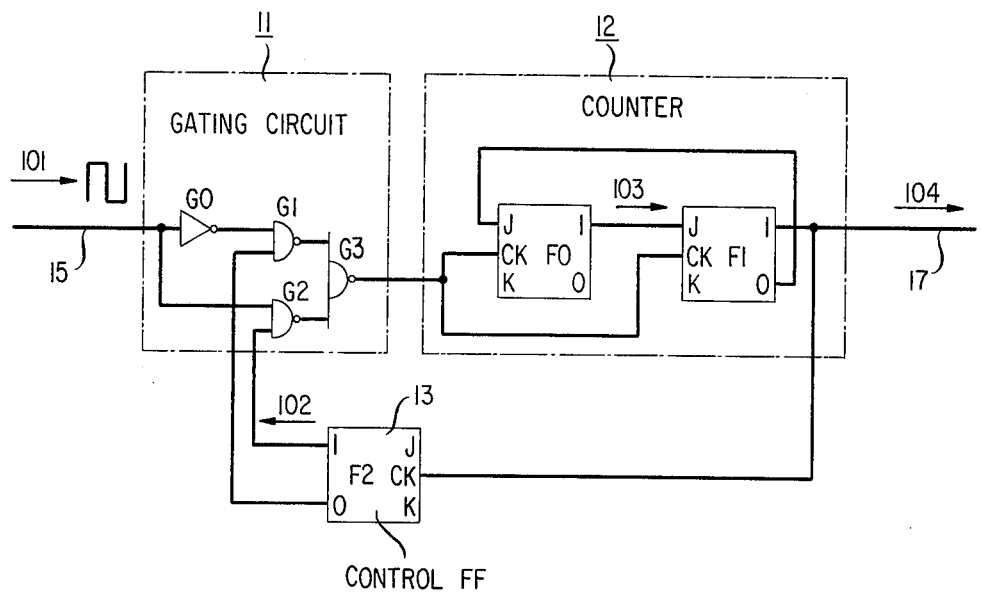
FIG. 1 is a schematic representation of an N/2 frequency divider circuit in accordance with one embodiment of my invention where N is equal to 5.

One embodiment of my N/2 frequency divider circuit is shown in FIG. 1. This circuit divides the input frequency signal, which is assumed to be symmetrical, by 5/2. In this arrangement a gating circuit 11 is employed which will ultimately determine how, if at all, the original divider input signal is to be altered before being fed to the counter for processing. Flip-flops F0 and F1 which comprise the two-stage counter 12, and the F2 control flip-flop are designed to respond to the falling edges of an incoming clock pulse. In addition, initially, the aforementioned flip-flops are conveniently reset to the zero logic level. It is assumed that all labeled flip-flop inputs that are shown without input leads are at the logic 1 voltage level.

Figure 2:
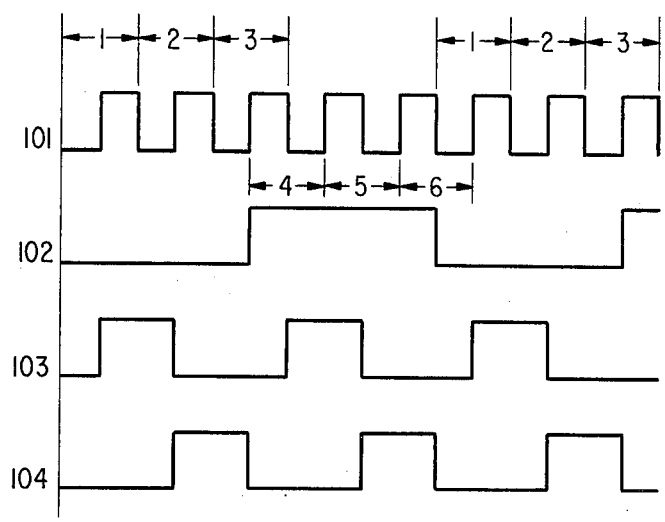
FIG. 2 shows the various waveforms associated with the aforementioned divider circuit shown in FIG. 1.

When an input pulse is fed to the gating circuit 11, NAND gate G1 is enabled while the output of NAND gate G2 is set at logic 1. When gating circuit 11 is in this state, the effect on a given pulse in waveform 101 (FIG. 2) is that it is inverted three times in succession as it is passed through inverter G0 and NAND gates G2 and G3. Although flip-flops F0 and F1 respond only to the falling edges of the output of gate G3, in this case the inverse of waveform 101, it is clear that from the point of view of an observer at lead 15 at the divider's input the counter appears to respond to the rising edges of pulses in waveform 101. Waveform 103, FIG. 2, which waveform is derived at the output of flip-flop F0, goes high during the occurrence of the rising edge of the first pulse period of waveform 101, and remains high until the occurrence of the rising edge of the second pulse period of waveform 101. At this point the persistence of a high signal on the J input of flip-flop F1 causes the output of flip-flop F1 to go high as indicated in waveform 104, producing on lead 17 the output waveform of the divider circuit. The output pulse shown in waveform 104 persists on lead 17 until the end of two and a half pulse periods of waveform 101. The falling edge of this output pulse, in turn, causes control flip-flop F2 to toggle.

The toggling of flip-flop F2 changes the state of gating circuit 11 so that NAND gate G2 is now enabled and the output of gate G1 is set at logic 1. When gating circuit 11 is in this second state the output of NAND gate G3 is caused to identically track the divider input waveform 101. Thus, the counter 12 which had formerly been responding to the logical inverse of waveform 101 is now caused to respond to a replica of waveform 101.

Thus, in FIG. 2, waveform 103 is again caused to go high during the first falling edge that has occurred subsequent to the toggling of flip-flop F2 as shown in waveform 102. At this point, as shown in waveform 101, the counter 12 appears to view the fourth pulse period as having begun when in actuality only two and a half pulse periods have occurred. The second pulse in waveform 103 persists until the falling edge of the fourth pulse period in waveform 101 whereupon the output of flip-flop F1 goes high for the second time and persists until the falling edge of the fifth pulse period of waveform 101. This second divider output pulse, as before, causes flip-flop F2 to toggle and effectively places the gating circuit 11 into its first state in which it passes the inverse of the input signal 101 to the counter. Thus, the counter is again sensitive to the rising edges of pulses in waveform 101 and begins to count the next three rising edges of waveform 101.

It can, therefore, be seen that divider output waveform 104 contains two equally spaced output pulses occurring during every five pulse periods of input waveform 10. It is necessary that input waveform 101 be symmetrical since the counter obtains its timing from the edges of the input pulses. If waveform 101 were to be nonsymmetrical the resultant output pulses, though recurring in a regular pattern, would not be equally spaced. Thus, if the equal spacing requirement is relaxed and my arrangement alternatively is employed strictly as a counter to produce two output pulses for every N input pulses, then input waveform 101 need no longer be symmetrical.

Accordingly, the arrangement of FIG. 1 is seen to contain $\log_2(N+1)$ flip-flops, in this case three, and to respond to an incoming pulse train independent of pulse frequency. In addition, it does not contain in its design any delay elements such as a one-shot multivibrator.

Figure 3:
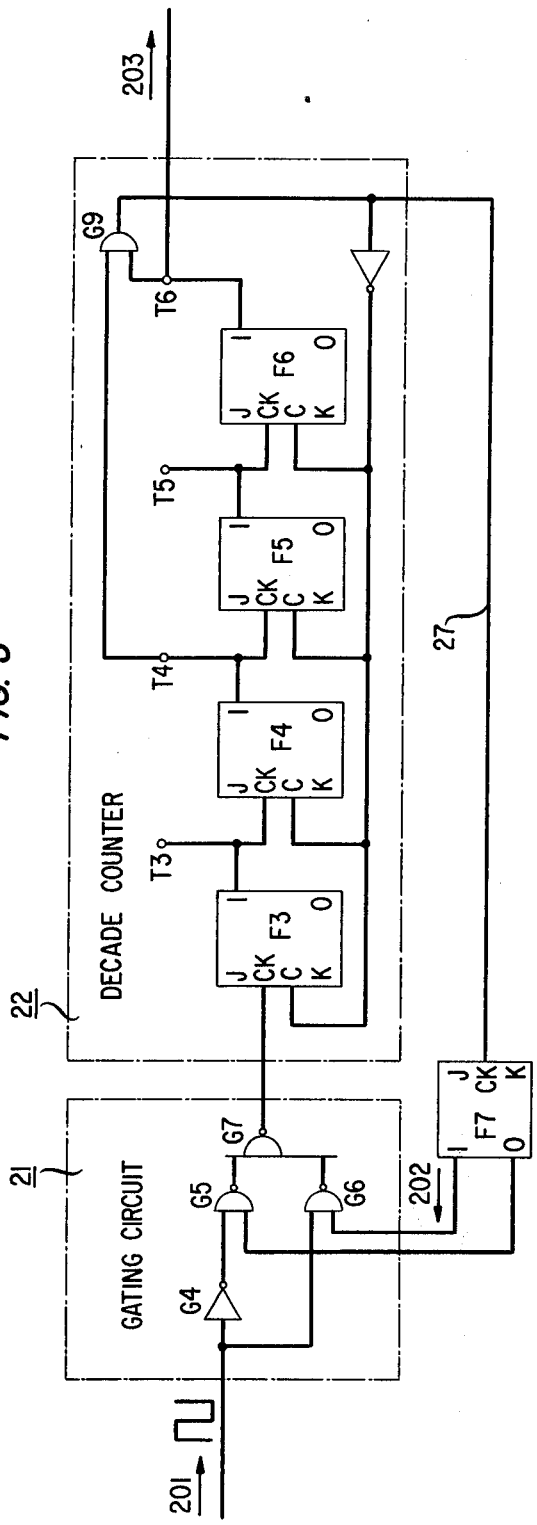
FIG. 3 is a schematic representation of a second embodiment of my invention comprising a divide-by 19/2 circuit which employs a decade counter.
Figure 4:
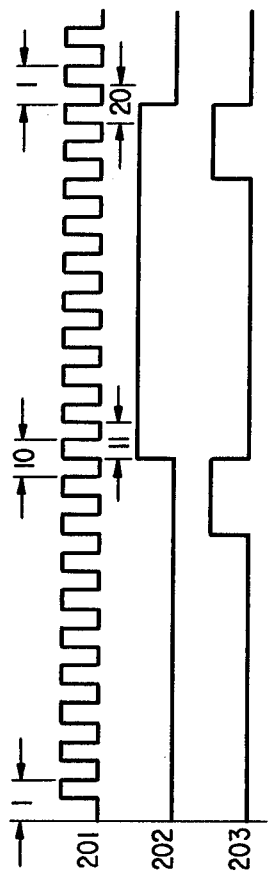
FIG. 4 shows associated waveforms that are inputs to or are generated in the divider circuit of FIG. 3.

In FIG. 3 an alternate embodiment of an N/2 frequency divider circuit is shown where N is 19. In this arrangement a decade counter 22 as described in FIG. 17–38, *Integrated Electronics: Analog And Digital Circuits and Systems*, J. Millman and C. C. Halkias, page 640, is employed. The design of this counter is such that when a count of ten is reached, flip-flops F3 through F6 are reset to zero. In accordance with my invention as shown in FIG. 3, AND gate G9 which heretofore had only been used as shown by Millman supra to reset the counter 22 is now provided with a lead 27 to control flip-flop F7 to toggle this flip-flop after ten pulse periods have elapsed. The toggling of flip-flop F7 in turn causes decade counter 22 to appear to be responding to the falling edges of input waveform 201 shown in FIG. 4. In addition, the output of flip-flop F6, as shown in waveform 203, occurs during the eighth pulse period of waveform 201, and persists to the middle of the tenth pulse period.

Figure 5:
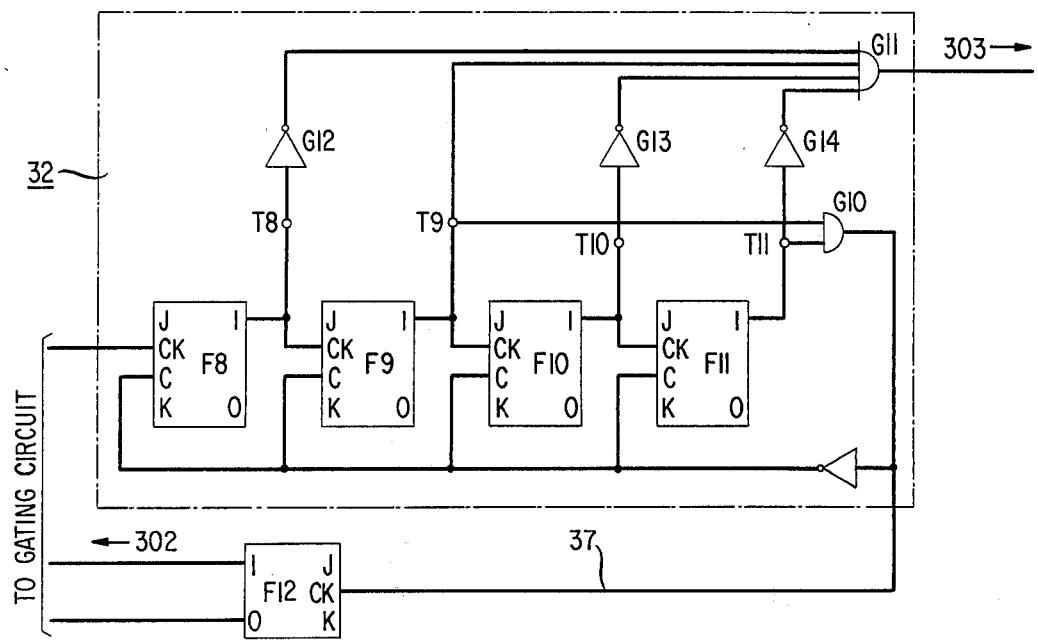
FIG. 5 is a schematic representation of an alternate arrangement of the decade counter depicted in FIG. 3 wherein a decoding AND gate is employed.
Figure 6:
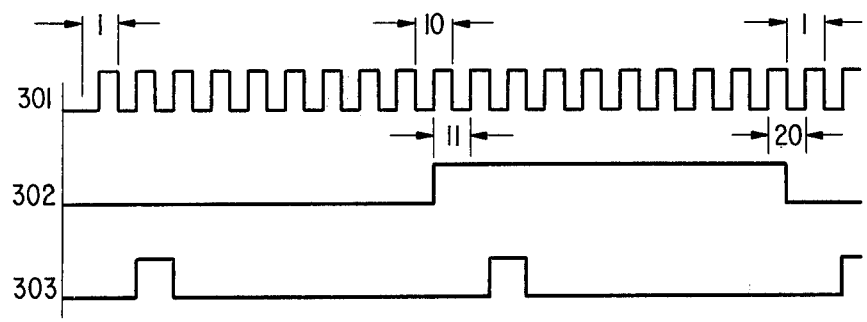
FIG. 6 shows waveforms associated with the arrangement in FIG. 5.

It is apparent that, alternatively, an output pulse could be derived at any preselected point in the counting sequence by appropriately utilizing a decoding AND gate whose input leads would, by using inverters, be derived from any combination of both the actual and inverted versions of signals appearing at the intermediate terminals associated with flip-flops of the decade counter 22. For example, an arrangement similar to the one depicted in FIG. 3 but employing a decoding AND gate to produce the output waveform is shown in FIG. 5. Terminals T8 through T11, associated with flip-flops F8 through F11, are additionally utilized in this embodiment to produce an output pulse as shown in FIG. 6, waveform 303, which occurs whenever the counter achieves the count of two in its counting sequence. Similarly, equally spaced output pulses can be produced for any preselected count which is achieved by this counter during its counting sequence.

Accordingly, I have described an N/2 pulse frequency divider that requires only $\log_2(N+1)$ flip-flops, and does not utilize any delay elements. Numerous other embodiments may be devised of by those skilled in the art without departing from the spirit and scope of the within-described invention.

What is claimed is:

1. A frequency divider circuit for deriving two output pulses for every N input pulses where N is an odd number comprising:
    a source of pulses,
    gating means having two operating states and either of said states to the other thereof, a third input connected to said source and an output terminal for reproducing said input pulses at said output terminal in one of said states and for inverting said input pulses at said output terminal in the other of said states,
    synchronous counter means having an input connected to said gating means output terminal and selectively operated in response to a receipt of each group of (N+1)/2 of said reproduced and of said inverted input pulses from said output terminal for producing an output pulse, said counter means including,
        a plurality of J-K flip-flops each having a J data input, a K data input, a clock input and logic outputs,
        means for interconnecting particular ones of said data inputs and said outputs of said plurality of flip-flops, and
        means connecting said clock inputs of each of said flip-flops in parallel to said gating means output terminal for changing the state of individual ones of said flip-flops in response to a receipt of a pulse from said gating means output terminal synchronously to increment a pulse count, and
    toggle switch means having outputs connected selectively to actuate one of said pair of inputs of said gating means and an input responsive to a receipt of said counter means output pulse for effecting a toggling of said switch means to switch the state of said gating means and for effecting the inverting of said pulses at said gating means output terminal to yield two equally spaced output pulses upon the receipt of two of said groups of (N+1)/2 pulses at said output terminal.

2. The arrangement in accordance with claim 1 wherein N has a value of 5, said plurality of J-K flip-flops includes a first and a second J-K flip-flop, each said logic outputs has a logic zero and a logic one output and said interconnecting means comprises a first connection between said J data input of said first flip-flop and said zero output of said second flip-flop, a second connection between said logic one output of said first flip-flop and said J input of said second flip-flop,
   a third connection between said K input of said first flip-flop and a logic one voltage source,
   a fourth connection between said K input of said second flip-flop and said logic one voltage source,
   a first counter output lead connected to said logic one output of said second flip-flop to provide two equally spaced divider output pulses for every five divider input pulses, and
   a second output counter lead connected to said logic one output of said second flip-flop to provide said counter means output pulse to toggle said toggle switch means after every three counter input pulses.

3. An arrangement for dividing the frequency of symmetrical input pulses by N/2 where N is an odd number comprising:

logic circuit means having a first input to receive said symmetrical input pulses and a pair of control terminals for determining the passage to an output terminal of an exact replica of said input pulses when operating a first mode and the passage of an inverted replica thereof when operating in a second mode,
   bistable switch means having a pair of outputs connected to said pair of control terminals for switching the operating mode of said logic circuit means,
   counting means connected to said output terminal of said logic circuit means and resettable in response to a receipt of a sequence of (N+1)/2 of said inverted replica or of said exact replica of said input pulses for producing an output pulse during said sequence, wherein said counting means includes:
   a plurality of interconnected flip-flops each having a logic output actuated to a predetermined logic value when a pulse is received at a clock input thereof, and
   decoder gating means having inputs connected to any said logic output of particular ones of said flip-flops for selectively deriving said output pulse upon a receipt of any designated one of said (N+1)/2 pulses of said sequence to allow the production of said output pulse during the achievement of any preselected one of a plurality of counts by said counting means, and
   means connected between said counting means and said switch means operated in response to a receipt by said counting means of the last pulse in said sequence for activating said switch means to switch the mode of said logic circuit means at the end of said sequence.

\* \* \* \* \*

UNITED STATES PATENT AND TRADEMARK OFFICE
CERTIFICATE OF CORRECTION

PATENT NO. : 4,041,403
DATED : August 9, 1977
INVENTOR(S) : Richard S. Chiapparoli, Jr.

It is certified that error appears in the above-identified patent and that said Letters Patent are hereby corrected as shown below:

Column 4, line 40, after "and" insert --a pair of inputs selectively actuatable to switch from--.

Signed and Sealed this

Ninth Day of May 1978

[SEAL]

Attest:

RUTH C. MASON
Attesting Officer

LUTRELLE F. PARKER
Acting Commissioner of Patents and Trademarks